United States Patent [19]
Pace et al.

[11] Patent Number: 5,143,855
[45] Date of Patent: Sep. 1, 1992

[54] METHOD FOR MAKING CONTACT OPENINGS IN COLOR IMAGE SENSOR PASSIVATION LAYER

[75] Inventors: Laurel J. Pace, Rochester; William C. McColgin, Pittsford, both of N.Y.

[73] Assignee: Eastman Kodak Company, Rochester, N.Y.

[21] Appl. No.: 716,445

[22] Filed: Jun. 17, 1991

[51] Int. Cl.$^5$ .................. H01L 21/56; H01L 27/14; H01L 31/0216
[52] U.S. Cl. .................... 437/3; 437/228; 437/229; 430/7; 156/659.1
[58] Field of Search .................. 437/2, 3, 228; 430/7

[56] References Cited

U.S. PATENT DOCUMENTS 4,783,691 11/1988 Harada .................. 357/30
4,786,819 11/1988 Tei .................. 250/578

FOREIGN PATENT DOCUMENTS 61-296763 12/1986 Japan .................. 437/3

Primary Examiner—Olik Chaudhuri
Assistant Examiner—David E. Graybill
Attorney, Agent, or Firm—Raymond L. Owens

[57] ABSTRACT

This invention relates to a method for fabricating a color solid-state image sensor which comprises, the steps of: forming an inorganic passivation layer over an array of photosensing elements and their associate bonding patterns; providing a color filter array over the passivation layer; forming a photoresist layer over the color filter array and other exposed areas; forming a pattern in the photoresist such that portions over the bonding pad areas are opened; and removing selective regions of the passivation layer to expose the bonding pads.

5 Claims, 2 Drawing Sheets

↓ COAT AND PATTERN PHOTORESIST

↓ ETCH PASSIVATION LAYER AND REMOVE PHOTORESIST

↓ COLOR FILTER FABRICATION

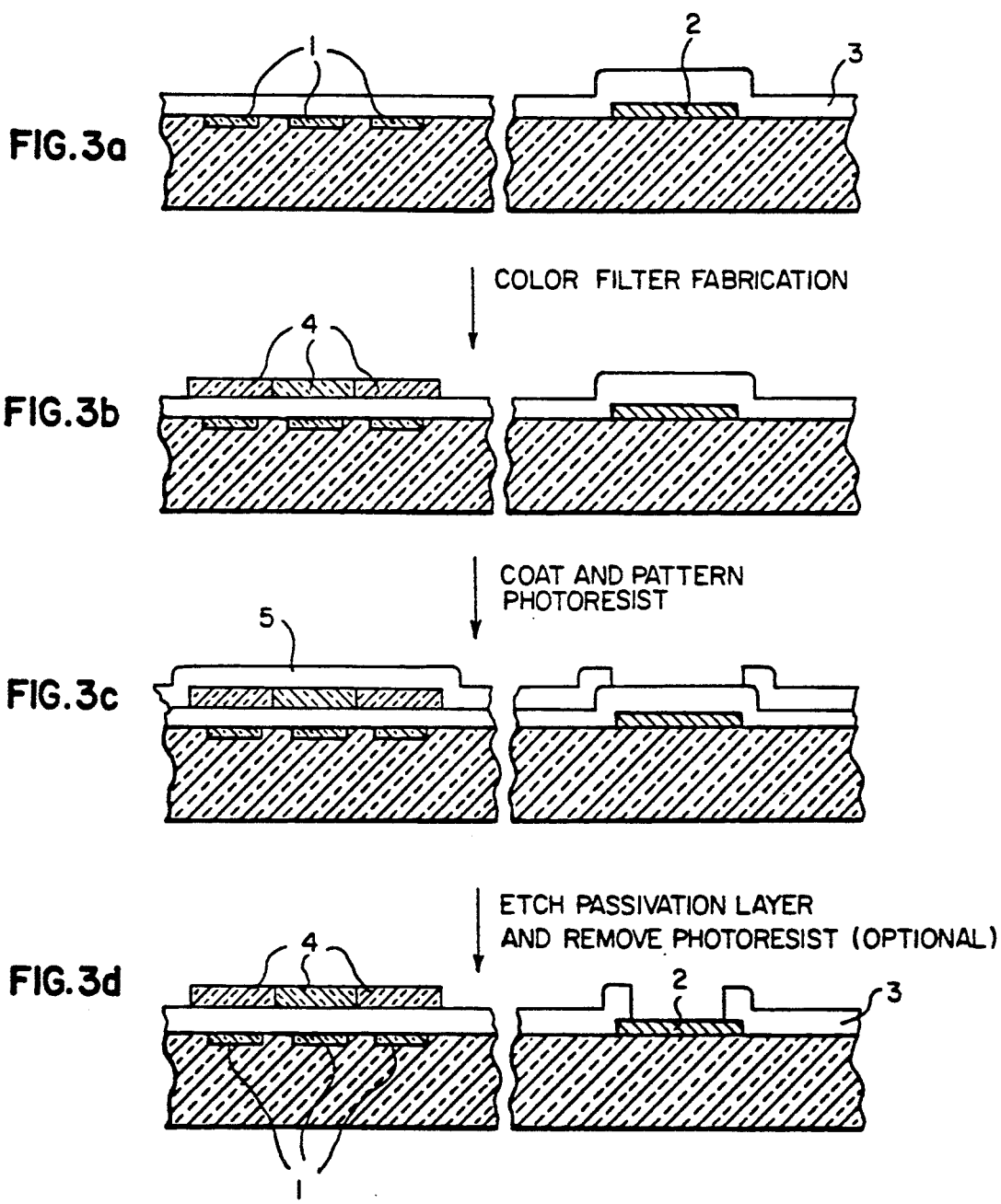

METHOD FOR MAKING CONTACT OPENINGS IN COLOR IMAGE SENSOR PASSIVATION LAYER

BACKGROUND OF THE INVENTION

1. Field of the Invention

This invention relates to a method for fabricating a color solid-state image sensor of the type having an overlying passivation layer onto which color filters are fabricated.

2. Description of the Prior Art

FIG. 1 shows a schematic representation of a cross-section of a support on and in which color solid-state imaging devices have been fabricated. The support is comprised of photosensing elements 1 and bonding pad areas 2. A passivation layer 3 covers the radiation-sensitive area but is removed from the bonding pad areas. Color filters 4, each of which is composed of one or more layers of a dyed coating, are fabricated over the passivation layer in registration with the photosensing elements.

FIGS. 2a-2d illustrate the different steps of one method for making such a color solid-state image sensor. According to this method, the portion of the passivation film that covers the bonding pad areas is removed prior to the coating of the color filter layers. A major disadvantage to this approach is that the bonding pad metallization is exposed to all of the color filter processing including the cleaning process, coating solutions, dye baths, etc. As a result, the chemicals that are used in these process steps may either attack and corrode the bonding pad metal during color filter fabrication, or they may become trapped in the bonding pad area and cause reliability problems as they interact with the metal over time. Also, the additional topography generated as a result of the passivation layer being removed over the bonding pads may contribute to coating non-uniformities in the subsequent color filter layers.

The following two patents describe the patterning of a layer beneath color filters:

U.S. Pat. No. 4,786,819 granted to Tei et al describes a method for fabricating a contact type color image sensor comprising the steps of forming a plurality of photoelectric converting elements having light receiving areas on a substrate; forming a passivation layer on selected light receiving areas, forming a light shielding film on said passivation film by depositing a thin film of metal and forming a color filter on other selected light receiving areas of each photoelectric converting element by forming a dyeable polymer layer and dyeing said dyeable polymer layer. The main drawback of such a method lies in its complexity. Furthermore, nothing is clearly described in this patent as regards to the patterning step used to make contact openings in the passivation layer that is under the color filters.

U.S. Pat. No. 4,783,691 issued to Harada suggests cutting through a color filter protection layer, a silicon carbide layer and an amorphous silicon photoconductor using an "ordinary etching technique". The method used for forming the pattern or performing the etch is not presented. Given the chemical diversity of the materials which have to be removed, such a process would be rather complex.

SUMMARY OF THE INVENTION

It is the object of the present invention to provide a method for making contact openings for a bonding pad pattern in an inorganic passivation layer on which color filters have been fabricated.

The above object is achieved in a method for making contact openings for a bonding pad pattern in any wet etchable inorganic passivation layer on which color filters have been fabricated, comprising the steps of:

(a) forming an inorganic passivation layer over an array of photosensing elements and their associated bonding pads, (b) providing a color filter array over the passivation layer, (c) forming a photoresist layer that covers the color filter array and other exposed layers, (d) forming a pattern in the photoresist such that portions over the bonding pad areas are opened, and (e) removing by wet etching selective regions of the passivation layer to expose the bonding pads.

BRIEF DESCRIPTION OF THE DRAWINGS

FIGS. 3a-3d illustrate the different steps of the method according to the invention.

DETAILED DESCRIPTION OF THE PREFERRED EMBODIMENTS

Figure 1:
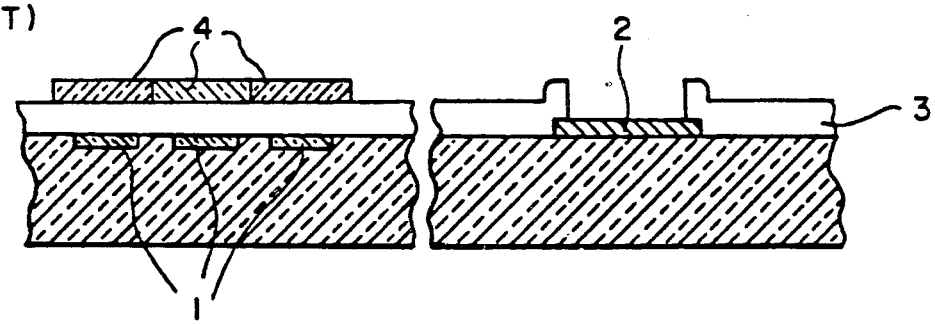
FIG. 1 is a schematic representation of a cross-section of a support on/in which color solid-state imaging devices have been fabricated.
Figure 2A:
FIGS. 2a-2d are schematic representations for illustrating the different steps of a method for making a color solid-state image sensor of the type represented in FIG. 1.
Figure 2B:
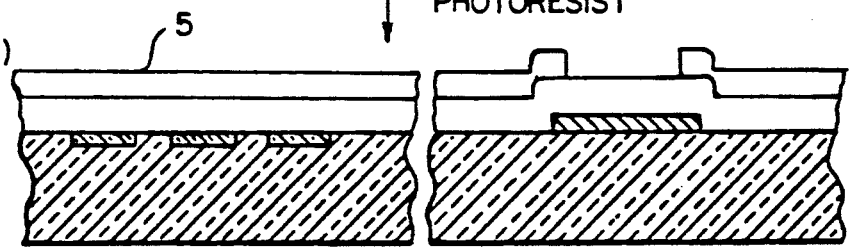
Figure 2C:
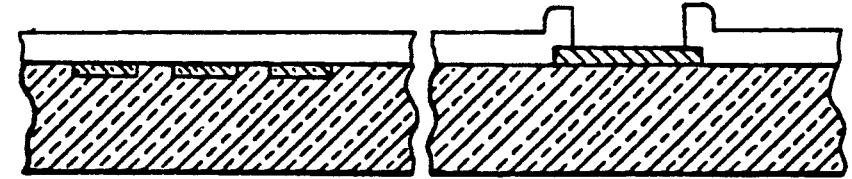
Figure 2D:
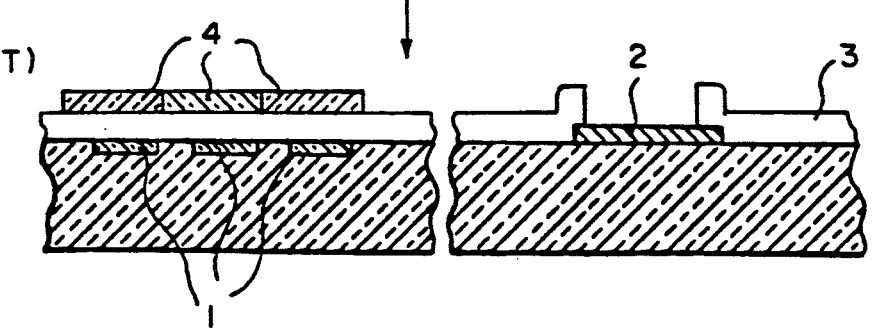

FIGS. 3a-3d illustrate the different steps of the method according to the invention. Those component elements that are similar to those depicted in FIG. 1 are designated by the same reference numerals.

Shown in FIG. 3a is an almost completed image sensor structure having photosensing elements 1. The bonding pad areas 2 are part of the wiring pattern and are used to connect the wiring pattern to external electronic circuits. The bonding pads are usually made of aluminum or one of its alloys, although other materials may also be used. The passivation layer 3 is grown or deposited over the entire device and may be composed of a layer or layers of silicon oxide or silicon oxynitride that may contain dopants such as boron, phosphorous, etc. This layer serves to protect the sensor from physical damage and from metallic and other contaminants.

In FIG. 3b the color filters have been provided over the passivation layer. These filters, which are superimposed in microregistration on the photosensing elements, can be composed of filter dyes in an organic matrix and can be prepared using a variety of materials and processes (see e.g., Hartman, U.S. Pat. No. 4,315,978; Martin, U.S. Pat. No. 4,355,087; Pace and Blood, U.S. Pat. No. 4,764,670).

In FIG. 3c, the substrate has been coated with a photoresist 5, pattern-wise exposed, and developed. The photoresist coating, exposure, and development steps are carried out using techniques that are standard to the semiconductor industry. The coating is of a standard thickness used in the semiconductor industry (1-2 $\mu$m), although other thicknesses should also provide acceptable performance. In FIG. 3d, the passivation layer has been removed from those areas left exposed by the photoresist, and the photoresist has been removed. The photoresist may be removed after the passivation layer is etched, after wafer or device electrical tests, or may remain permanently over the color filters as a protective layer.

If the photoresist is to be removed, a positive-working photoresist must be used for this process. The requirements for the photoresist are that it adhere well to both organic and inorganic materials and that it be readily removed by solvents that do not adversely affect the color filters either spectrally or physically. If the coating is to remain on the wafer through some of the packaging steps, it will need to withstand any high temperature processing required. The photoresist may be one of the many commercially available positive photoresists such as "KTI-809" and "KTI-820" (KTI Chem. Corp.), "HPR-204" (Olin-Hunt Specialty Prod.), "PR-21" (J. T. Baker Chem. Co.), and "AZ-1375" (American Hoechst Corp.). For photoresist coatings that will be subjected to elevated temperatures during packaging or other steps, the lower $T_g$ photoresists (e.g., "KTI-809", "HPR-204", and "AZ-1375") are preferred because they are easier to remove after they have been baked than are the higher $T_g$ photoresists.

For improved adhesion of the photoresist, the substrate may be subjected to a silylating pretreatment prior to coating the photoresist. In addition, baking the photoresist layer after coating and/or after development will also improve the adhesion characteristics of the layer. These procedures are standard to the semiconductor industry. A post-development UV exposure of the coating can be carried out to assure that the photoresist coating doesn't crosslink over time. (This is only necessary if the photoresist coating remains on the substrate for an extended period of time or if it is subjected to heating.)

If the photoresist is to remain as a permanent protective layer, either a positive- or negative-working photoresist may be used. The requirements for the photoresist are that it adhere well to both organic and inorganic materials and that it be sufficiently transparent (transmission of at least 75% and preferably greater than 90%) in the visible region of the spectrum (400-700 nm). The positive photoresists listed above are slightly colored, particularly in the blue (400-500 nm) region of the spectrum, but may be acceptable, especially if a relatively thin (<1 μm) coating is used. Other candidates are deep-UV sensitive positive photoresists such as "Shipley Microposit Planarizing Layer SAL 110-PL1", which is completely transparent in the visible region of the spectrum. Negative photoresists such as "Kodak MicroResist 747" tend to be slightly yellow in color, but may be acceptable in thin layers.

If the photoresist is to be removed, the process used to etch the inorganic passivation layer must not interfere with the ability to strip the photoresist. If a fluorine-based plasma etch process is used to etch the passivation layer, which is typically the case in the semiconductor industry, the plasma chemistry tends to cause the photoresist to harden to such a degree that only an oxygen plasma strip process or a very aggressive wet strip process can successfully remove it. However, the color filters, like the photoresist, are organic-based, and unless there is an etch stop layer over them, they will be physically damaged, faded, or etched by an oxygen plasma or attacked by an aggressive wet stripping solution. Incorporation of an etch stop layer would add considerably to the complexity of the process. Consequently, it is preferable to use a wet passivation etch process where the photoresist is not adversely altered during the etch and thus could be removed by a relatively mild procedure such as a wet stripping process that uses less aggressive solvents.

The preferred method of removal of the inorganic passivation material, a wet etch, is carried out by immersion of the substrate into a suitable etchant batch. For etching silicon oxide films, this bath may be composed of a buffered HF solution containing $NH_4F$ and HF, mixtures of $NH_4F$ and acetic acid, or any of a number of commercially available etch baths. The etchant bath may also contain additives, including glycerol, acetic acid, added aluminum, etc., which minimize attack of the bonding pad metallization by the etchant.

Since a wet passivation etch is preferred, it is required that the photoresist adhere well and maintain its integrity throughout the etch process. In general, photoresists are designed to adhere to inorganic materials (metals, oxides, etc.), but in this case, the resist must adhere to both the inorganic passivation layer and the organic layers such as the color filters and any organic planarizing layer.

If the photoresist is to be removed after the passivation layer has been selectively etched, the substrate (or individual chips if the removal process occurs after the wafer has been diced) is soaked or sprayed with the appropriate solvent(s). The photoresist removal step may occur immediately upon completion of the passivation layer etch step or may be delayed until after the device has been tested or even after it has been sawed, affixed to a mount, and wirebonded. Choice of photoresist removal solvent will be dependent on the type of polymer matrix and dyes that are used to make up the color filters. A single solvent, two or more solvents in sequence, or mixtures of solvents may be used. In this manner the solubility parameters may be adjusted to permit removal of the photoresist without damage to the filter array.

The photoresist removal procedure should not alter the color filter spectral or physical properties (e.g., shrinking, cracking, adhesion loss). Wet stripping of photoresists is generally accomplished using commercial stripping solutions containing acetone and/or some relatively strong solvents such as N-methyl-pyrolidinone (NMP). Use of low boiling point solvents such as acetone can cause hazing and/or cracking of the color filters, possibly due to the rapid rate of drying. Other solvents, such as NMP, are capable of swelling many color filter materials, resulting in distortion of the filters, adhesion loss, and/or removal of some of the dye from the layer. Use of the photoresist developer itself is not an option since it is so highly basic that it will remove most water soluble dyes from the standard gel or mordant color filter matrix. It may be possible to prevent penetration of the removal solvent by using a protective overcoat over the color filter, but again this adds to the process complexity. A preferable approach is to use a solvent or a combination of solvents that is strong enough to remove the photoresist but not so strong as to adversely affect the color filters.

Several photoresist solvent removal systems have been used successfully and some examples follow: Cyclohexanone (boiling point 153° C.) by itself will remove most photoresist coatings and will dry slowly enough that the color filters are unaffected. In some cases, depending on the composition of the color filters, it may be possible to use NMP. However, the high boiling point (202° C.) of NMP sometimes makes it difficult to dry the substrate in a reasonable amount of time; in order to decrease processing time by speeding up the rate of drying, the NMP rinse can be followed by a water rinse. Acetone (boiling point 56° C.) can cause cracking and hazing of the color filter surface, but this effect can be minimized if the acetone rinse is followed immediately by a rinse with a miscible, higher boiling point solvent (e.g., water) in order to retard the rate of drying. Solvent mixtures may also be used. For example, while n-butanol has been observed to cause cracking of color filters in some instances, mixtures of n-butanol with a miscible, higher boiling point solvent in which the photoresist does not necessarily have to be soluble, e.g., xylene (boiling point 140° C.), can still successfully remove the photoresist while not attacking the color filter. Concentrations of n-butanol as low as 10% have been used, but it is preferred to use a slightly higher concentration ($\geq 20\%$) so that the photoresist will dissolve quickly.

The primary advantage to the process described in this invention is that no "etch stop" over the color filters is required, so the same number of steps are used as with the alternative approach of etching the passivation layer before color filter fabrication.

There is the additional advantage of providing a layer that can remain on the substrate through a number of testing and packaging steps, protecting the photosensing elements from contamination and physical abrasion while still providing access to the bonding pads so that electrical testing can be carried out.

The invention has been described in detail with particular reference to a certain preferred embodiment thereof, but it will be understood that variations and modifications can be effected within the spirit and scope of the invention.

We claim:

1. A method of making contact openings for a bonding pad pattern in an inorganic passivation layer on which color filters have been fabricated, comprising the steps of:
   (a) forming an inorganic passivation layer over an array of photosensing elements and their associated bonding pad patterns;
   (b) providing a color filter array over the passivation layer;
   (c) forming a photoresist layer that covers the color filter array and other exposed layers;
   (d) forming a pattern in the photoresist such that portions over the bonding pad areas are opened; and
   (e) removing by wet etching selective regions of the passivation layer to expose the bonding pads.

2. A method according to claim 1 characterized in that it further comprises the steps of removing the overlying photoresist.

3. A method according to claim 1 characterized in that the photoresist is a positive-working photoresist.

4. A method according to claim 1 characterized in that the photoresist is a negative-working photoresist.

5. A method according to claim 2 characterized in that the photoresist removal is realized by using a mixture of n-butanol and xylene.

* * * * *